(12) United States Patent
Liu

(10) Patent No.: US 6,695,637 B1
(45) Date of Patent: Feb. 24, 2004

(54) TRAY-STYLE MEMORY CARD CONNECTOR

(76) Inventor: Wen-Tsung Liu, Fl. 5, No.1, Lane 45, Pao-Shing Rd., Hsin Dian City, Taipei (TW)

( * ) Notice: Subject to any disclaimer, the term of this patent is extended or adjusted under 35 U.S.C. 154(b) by 0 days.

(21) Appl. No.: 10/244,021

(22) Filed: Sep. 16, 2002

(51) Int. Cl.[7] .............................................. H01R 13/64
(52) U.S. Cl. ...................... 439/377; 439/135; 439/374
(58) Field of Search ................................ 439/377, 374, 439/68, 67, 135, 891, 946

(56) References Cited

U.S. PATENT DOCUMENTS 5,451,168 A * 9/1995 Shuey ........................ 439/159
6,030,238 A * 2/2000 Dong ......................... 439/159
6,224,391 B1 * 5/2001 Horie et al. .................. 439/64
6,264,483 B1 * 7/2001 Wilson ....................... 439/137

* cited by examiner

Primary Examiner—Dean A. Reichard
Assistant Examiner—Adolfo Nino

(57) ABSTRACT

This invention provides a tray-style memory card connector comprising of a base and a main body that can slide smoothly on the base. The base has a plug structure on one end, which has a guide groove on each side. There is a retracting structure on the base, and when it is pressed down, the main body will separate from the base. There is a container on the said main body to contain a memory card. At each side of the container there is a groove. A slide rail is mounted between the groove and the guide groove. In this way, the main body can slide smoothly on the base.

14 Claims, 4 Drawing Sheets

TRAY-STYLE MEMORY CARD CONNECTOR

BACKGROUND OF THE INVENTION

1. Field of Invention

This invention relates to a connector structure, particularly relates to an innovative tray-style memory card connector structure.

2. Description of the Background Art

With the rapid development of new technologies, storage media has been widely used in PCs, Digital Cameras, MP3 players, Digital Video Camcorders, and commercial devices. As digital technologies and market demand evolve, storage media products increasingly expand in capacity while decrease in size.

Currently, most memory card products available in the market, such as CompactFlash cards, Smart Media cards, Multimedia cards, Secure Digital cards, and Memory Sticks, are light, thin, short, and small. They have exceeded 64 MB in capacity. Due to their advantages in size and portability, they are favored by customers and are becoming a substitute for diskettes or hard disks. To access the information stored in those products, usually a card connector device is required.

Traditional card connector products are mainly categorized into internal ones and external ones. For internal ones, as shown in FIG. 1, to access the information stored in a memory card, the memory card has to be inserted into a PCMCIA adapter, which then is inserted in a digital device (i.e., PC). For external ones, as shown in FIG. 2, the memory card has to be inserted into an external card connector, which connects to a PC via an interface, and than read the information stored in the memory card. In above card connector structures, the slots are both exposed and easy to be damaged due to inclusion of foreign matters (e.g., dust). Furthermore, the notch on the slot impairs the integrity sense.

The traditional internal/external card connector products have not only above disadvantages but also some pending problems that are not mentioned in above description, such as:

1. Most card connector products are designed to work with a specific type of memory cards.
2. Whether the card connector products can be designed as a tray structure to embed the memory card in it to avoid inclusion of foreign matters?
3. Whether the card connector products can be adaptable to all types of memory cards while with minimized size to be more convenient and portable?

In consideration of above disadvantages and pending problems related with traditional card connector products, the inventor invents a tray-style memory card connector.

SUMMARY OF THE INVENTION

The main purpose of this invention is to provide a tray-style memory card connector structure, which employs a tray-style main body to embed the memory card in it to avoid inclusion of foreign matters and consummate the integral structure.

To attain above purpose, the invention provides a tray-style memory card connector comprising of a base and a main body than can slide smoothly on the base. The base has a plug structure on one end, which has a guide groove on each side. There is a retracting structure on the base, and when it is pressed down, the main body will separate from the base. There is a container on the said main body to contain a memory card. At each side of the container there is a groove. A slide rail is mounted between the groove and the guide groove. In this way, the main body can slide smoothly on the base.

Another purpose of this invention is to provide an adaptable memory card connector structure, the container of which can host different types of memory cards (e.g., CompactFlash cards, Smart Media cards, Multimedia cards, Secure Digital cards, Memory Sticks, and other PC cards), eliminating the disadvantage of complex structure, large size, and high cost in traditional memory card connectors that utilize two or more slots to support multi types of memory cards.

The structure, principle, functions, and efficacy of this invention is detailed further in the following illustrations and descriptions.

Instruction to Symbols

1 Base
 11 Plug Structure
 12 Plug Chamber
 13 CF Contact PIN
 14 Guide Groove
 15 Retracting Unit
 16 Retracting Component
 161 Button
 17 Retracting Pole
 18 Pressing End
 19 Cover
2 Main Body
 21 Container
 22 Slide Groove
 23 Slide Rail
 24 Card Chamber
 25 Inserting Edge
 26 Contact Component

DETAILED DESCRIPTION OF THE DRAWINGS

Figure 1:
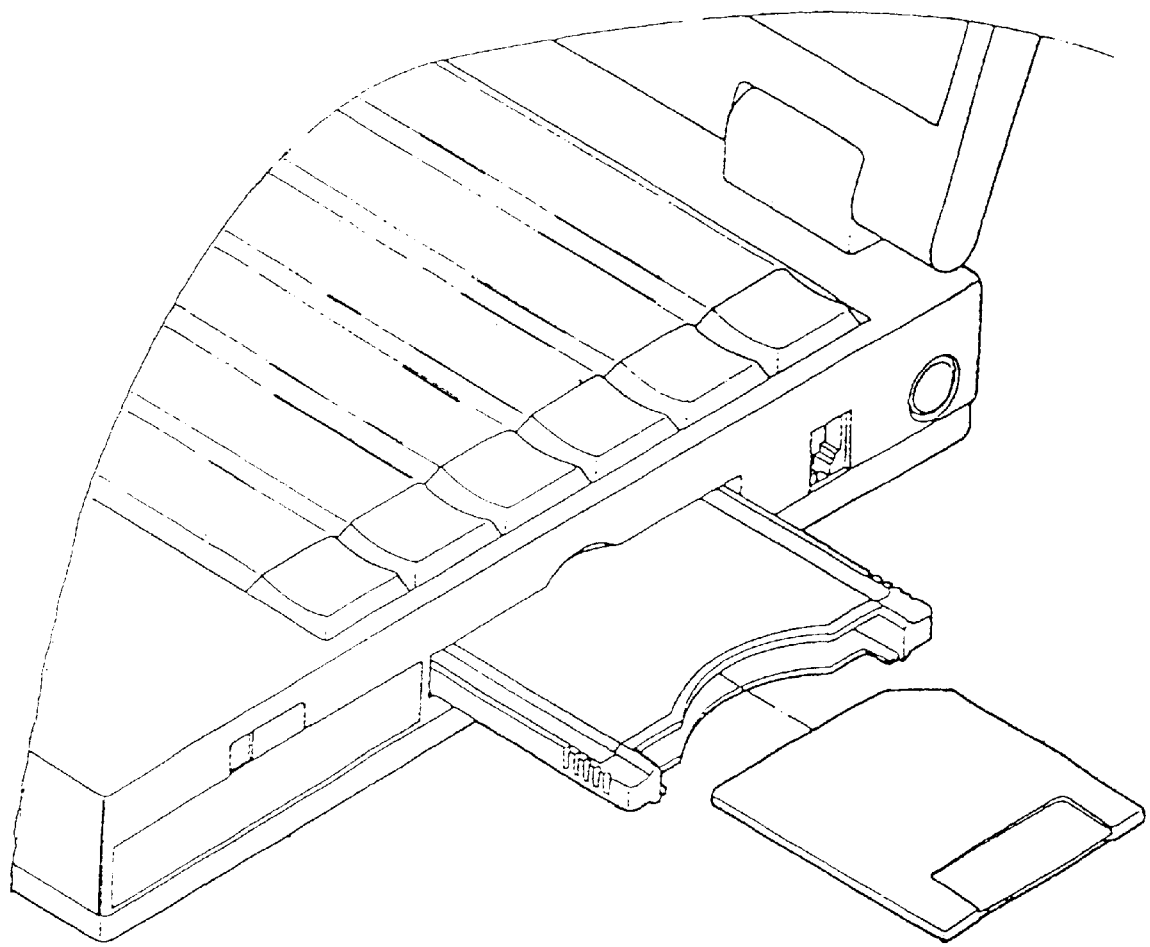
FIG. 1 is a sketch map of a traditional PCMCIA adapter.
Figure 2:
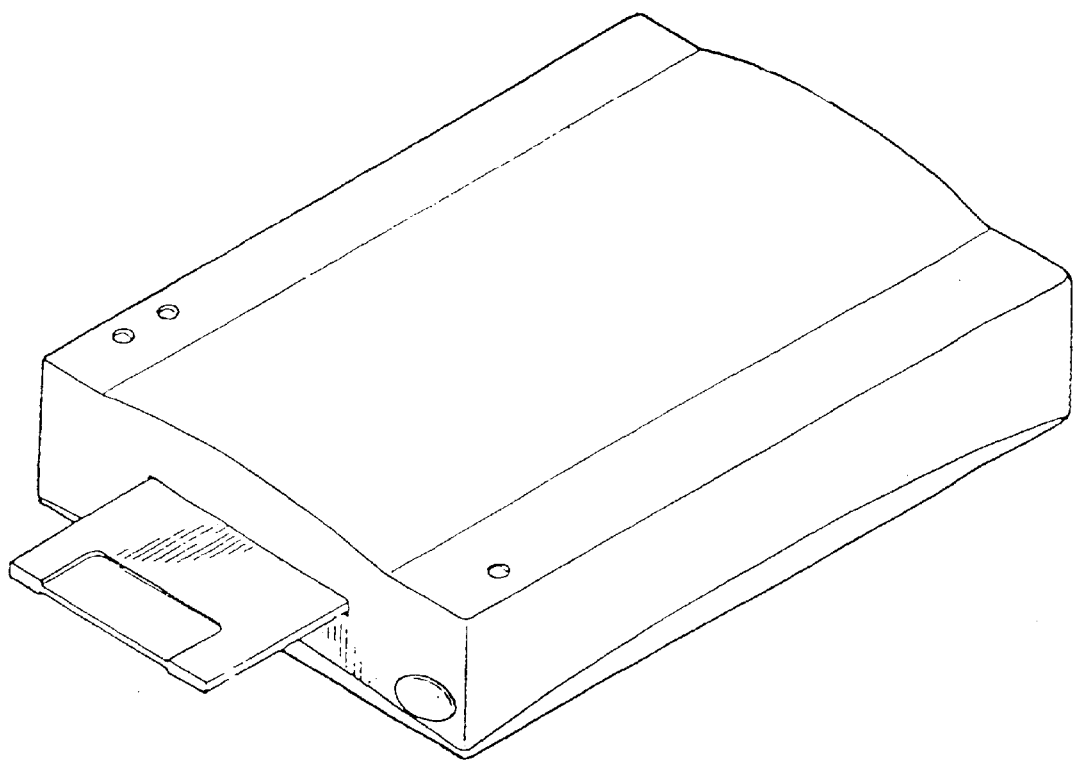
FIG. 2 is a sketch map of a traditional external card connector.
Figure 3:
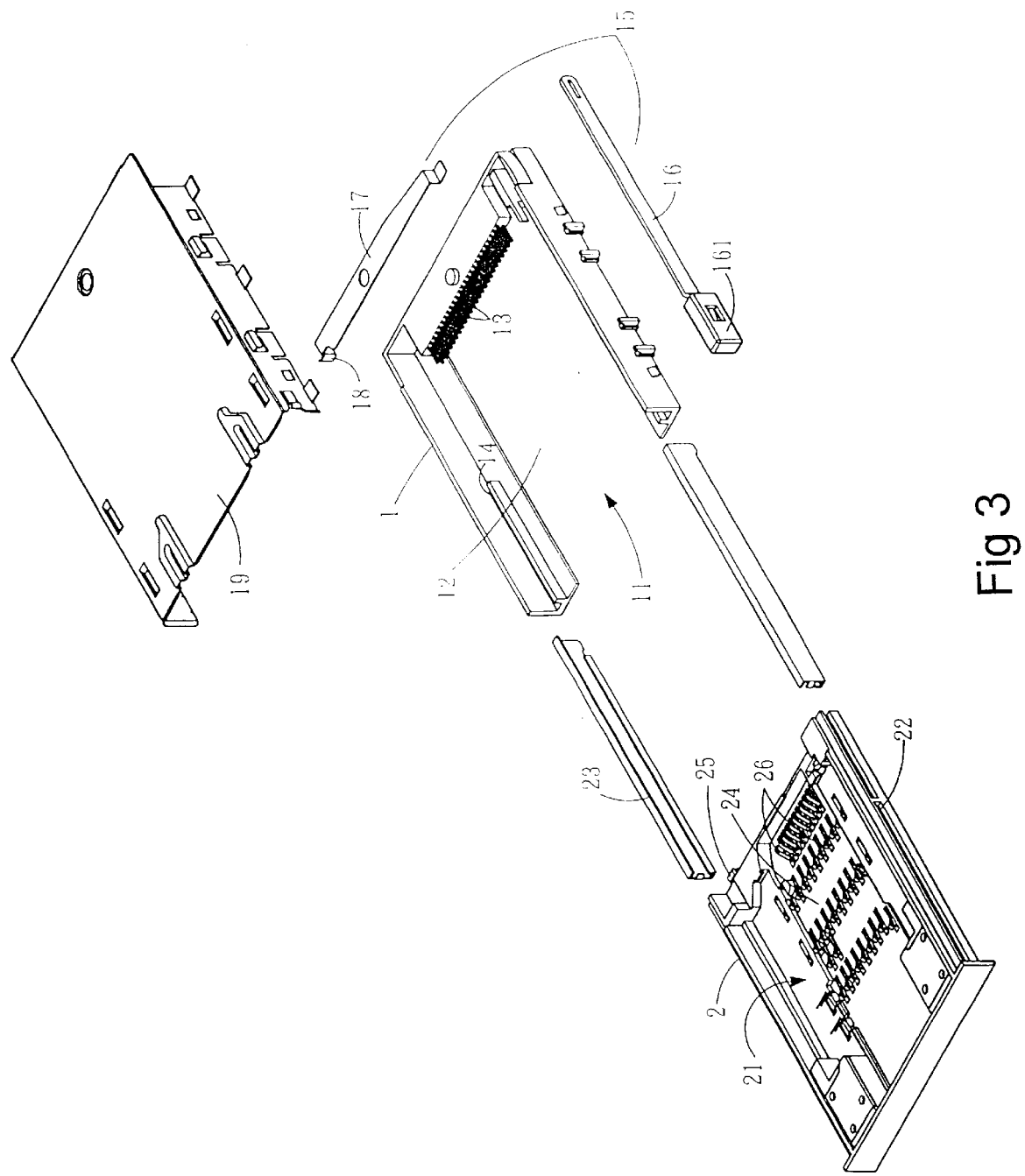
FIG. 3 is a 3D exploded view of this invention.
Figure 4:
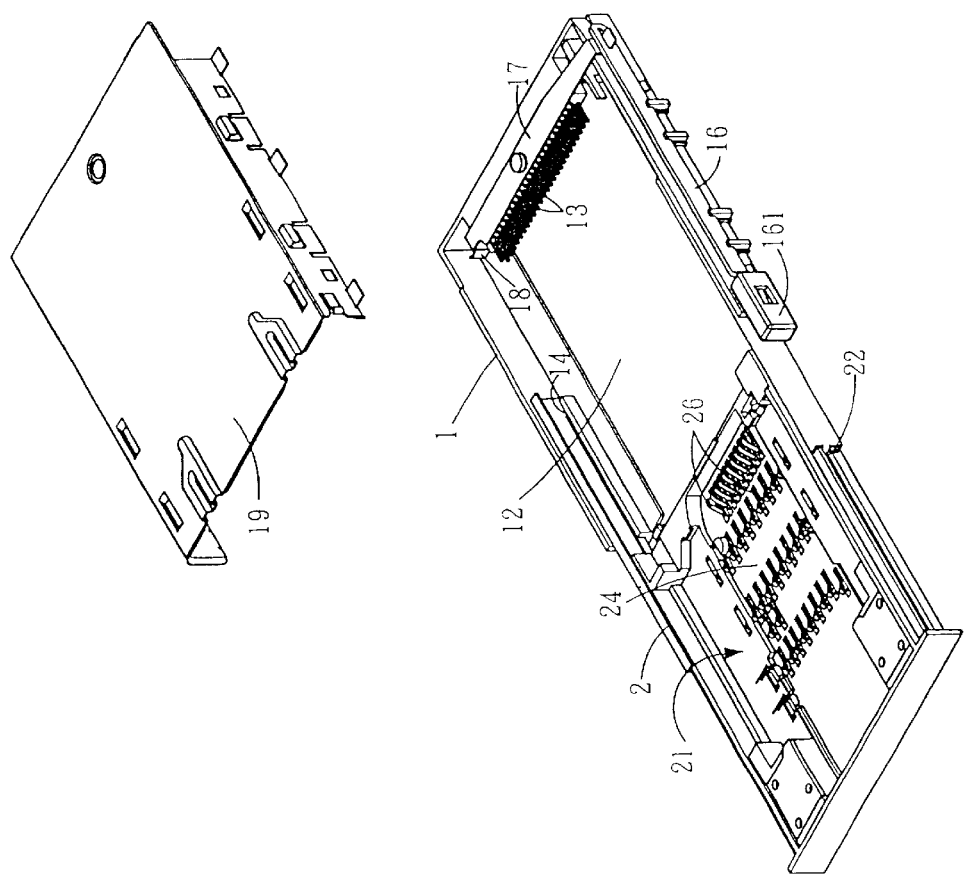
FIG. 4 is a 3D view of this invention.

Please see FIG. 3 and FIG. 4. This invention mainly comprise of a base 1 and a main body 2 that can slide smoothly on the base 1.

The base 1 has a plug structure 11 at one end, which has a plug chamber 12 extending backward. The plug chamber 12 has compact flash (CF) contact PINs 13 and a hole (not shown) horizontally. The plug chamber has a guide groove 14 at each end. There is a retracting unit 15 on the base 1, and the retracting unit 15 has a retracting component 16 and a retracting pole 17. The retracting component 16 is located on a side edge of the base 1, and it has a button 161 on one end and connects to the retracting pole 17 on the other end. The retracting pole 17 is mounted at an appropriate position above the contact PINs 13, and it is coupled with the retracting component 16 on one end and forms a pressing end 18 on the other end. The retracting unit 15 is used to separate the main body 2 from the base 1 towards the plug structure 11.

The main body 2 has a container 21, which can contain a memory card. The container 21 has a slide groove 22 on each side. The slide groove 22 can be coupled with the guide groove 11 through the slide rail 23 to make the main body 2 form a tray structure, which can slide smoothly on the base 1. The total structure constitutes a tray-style memory card connector. Because such a connector holds the memory card on the main body 2, which will be pushed into the base 1, the memory card can be embedded in the connector to avoid any damage of the connector or the memory card due to intrusion of foreign matters.

There is a cover 19 on the base 1, which can help to enhance the toughness of the entire structure to deliver more protection.

The container 21 on base 2 utilizes its card chamber 24 to hold memory cards of different models or sizes at different times, such as Compact Flash card, Smart Media card, Multimedia card, Secure Digital card, and Memory Stick. In this way, the said connector simplifies the structure significantly, decreases the cost, and reduces the size. It eliminates the disadvantages of traditional connectors or card drives that have to utilize two or more slots to support multi types of memory cards mentioned above.

Moreover, there is an inserting edge 25 on the main body 2, against the hole on the base 1. When the inserting edge 25 is coupled with the hole, the base 1 and the main body 2 can securely couple with each other and are not easy to separate.

There are several contact components 26 on the container 21 to transfer signals from the memory card.

What is claimed is:

1. A tray-style memory card connector comprising a base and a main body; the base has a plug structure on one end, which has a guide groove on each side; there is a container on the main body to contain at least one memory card; at each side of the container there is a groove; one groove couples with the corresponding guide groove through a slide rail to support the main body to slide smoothly into the base, thereby the at least one memory card being held by the main body and pushed together with the main body into the base.

2. The tray-style memory card connector as in claim 1, wherein a plug chamber extending backward from one end of the plug of the base, and the plug chamber has compact lash (CF) contact PINs and a hole.

3. The tray-style memory card connector as in claim 2, wherein there is an inserting edge on the main body, against the hole on the base; when the inserting edge is coupled with the hole, the base and the main body can securely couple with each other and are not easy to separate.

4. The tray-style memory card connector as in claim 1, wherein the base has a retracting unit to separate the main body from the base towards the end of the plug structure.

5. The tray-style memory card connector in claim 1, wherein the retracting unit comprising a retracting component and a retracting pole; the retracting component is mounted on one edge of the base and forms a button structure on one end and couples with the retracting pole on the other end; the retracting pole is mounted above the CF contact PINs, and it couples with the retracting component on one end and forms a pressing end on the other end to separate the main body form the base.

6. The tray-style memory card connector as in claim 1, further comprising a cover on the base to enhance the toughness of the entire connector structure.

7. The tray-style memory card connector as in claim 1, wherein the container of the main body has a card chamber for holds memory cards of different models or sizes.

8. The tray-style memory card connector as in claim 1, wherein the container has multiple contact components on a bottom of the card chamber.

9. A tray-style memory card connector, comprising
 a base, a plug structure being formed on one end of the base, a guide groove being formed at each side of the base; and
 a main body, having a container to contain at least one memory card, a groove being formed at each side of the container so that one groove couple with the corresponding guide groove through a slide rail to support the main body to smoothly slide into the base,
 wherein, the container of the main body utilizes its card chamber to hold memory cards of different models or size, and has a plurality of contact components on a bottom of the card chamber for signal transfer.

10. The tray-style memory card connector as in claim 9, wherein a plug chamber extending backward from one end of the plug of the base, and the plug end of the base has a plug chamber extending backward; the plug chamber has compact flash (CF) contact PINs and a hole.

11. The tray-style memory card connector as in claim 10, wherein there is an inserting edge on the main body against the hole on the base; when the inserting edge is coupled with the hole, the base and the main body can securely couple with each other and are not easy to separate.

12. The tray-style memory card connector as in claim 9, wherein the base has a retracting unit to separate the main body from the base towards the plug end.

13. The tray-style memory card connector in claim 9, wherein the retracting unit comprising a retracting component and a retracting pole; the retracting component is mounted on one edge of the base and forms a button structure on one end and couples with the retracting pile on the other end; the retracting pole is mounted above the CF contact PINs, and it couples with the retracting component on one end and forms a pressing end on the other end to separate the main body form the base.

14. The tray-style memory card connector as in claim 9, further comprising a cover on the base to enhance the toughness of the entire connector structure.

* * * * *